US006262825B1

(12) United States Patent
Mueller et al.

(10) Patent No.: US 6,262,825 B1
(45) Date of Patent: Jul. 17, 2001

(54) APPARATUS AND METHOD FOR THE ENHANCED IMAGEWISE EXPOSURE OF A PHOTOSENSITIVE MATERIAL

(75) Inventors: Gregory E. Mueller, Encinitas, CA (US); Daniel John Whittle, Bellingham, WA (US)

(73) Assignees: Napp Systems, Inc., San Diego, CA (US); Cymbolic Sciences, Inc., Bellingham, WA (US)

( * ) Notice: Subject to any disclaimer, the term of this patent is extended or adjusted under 35 U.S.C. 154(b) by 0 days.

(21) Appl. No.: 09/382,214

(22) Filed: Aug. 24, 1999

(51) Int. Cl.[7] .................................................. G02B 26/08
(52) U.S. Cl. ........................ 359/196; 359/211; 359/212; 359/223; 359/226; 347/260; 358/493
(58) Field of Search .......................... 359/196, 205–215, 359/220–223, 226, 315, 888; 347/258–260; 358/490–491, 493, 497

(56) References Cited

U.S. PATENT DOCUMENTS

| 3,783,152 | 1/1974 | Larsen ................................... 260/471 |
| 4,054,928 | 10/1977 | Butler et al. ........................... 360/79 |
| 4,263,392 | 4/1981 | Jones ..................................... 430/169 |
| 4,298,803 | 11/1981 | Matsuura et al. . | |
| 5,262,275 | 11/1993 | Fan ....................................... 430/273 |
| 5,348,844 | 9/1994 | Garmong .............................. 430/286 |
| 5,385,092 | 1/1995 | Lewis et al. .......................... 101/467 |
| 5,437,964 | 8/1995 | Lapin et al. .......................... 430/280 |
| 5,446,073 | 8/1995 | Jonsson et al. ....................... 522/104 |

FOREIGN PATENT DOCUMENTS

| 0639799 | 2/1995 | (EP) . |
| 2313975 | 12/1997 | (GB) . |

Primary Examiner—James Phan
(74) Attorney, Agent, or Firm—Foley & Lardner; Stephen E. Reiter

(57) ABSTRACT

In accordance with the present invention, there are provided apparatus and methods useful for efficiently subjecting photosensitive materials to a relatively low energy pre-exposure using the electromagnetic energy during the non-imaging portion of the exposure process (i.e., a backscan beam exposure) prior to subjecting such materials to the main imaging exposure (i.e., an imagewise exposure). In a further aspect of the present invention, there are provided combinations and improvements useful for the enhanced imagewise exposure of photosensitive materials. In additional aspects of the present invention, there are provided methods of enhancing the imagewise exposure of photosensitive materials, imagewise exposed photosensitive material made according to such methods, methods for enhancing sensitivity of a photosensitive material for imagewise exposure, and photosensitive materials having enhanced sensitivity for imagewise exposure made according to these methods.

18 Claims, 4 Drawing Sheets

APPARATUS AND METHOD FOR THE ENHANCED IMAGEWISE EXPOSURE OF A PHOTOSENSITIVE MATERIAL

FIELD OF THE INVENTION

The present invention relates to apparatus and methods for the treatment of photosensitive materials (i.e., printing plates) to impart an image thereon. In a particular aspect, the invention relates to apparatus for the enhanced imagewise exposure of photosensitive materials. In other aspects, the invention relates to methods for pre-treating photosensitive materials for imagewise exposure and for enhancing the imagewise exposure of photosensitive materials.

BACKGROUND OF THE INVENTION

Images can be imparted to photosensitive polymeric materials (e.g., materials employed for the production of printing plates) in a variety of ways. For example, a mask (typically a negative mask, although a positive mask can also be utilized) can be placed over the matrix, which is then exposed to energy sufficient to promote photoreaction of the matrix where exposed. Photoreaction occurs only where energy is allowed to impact the matrix. For negative acting materials, the unexposed photosensitive polymeric material is then removed (e.g., by washing), leaving the desired image material on the matrix. For positive acting materials, the exposed material is removed, leaving the desired image as a substantial absence of material on the matrix.

With the advent of laser technology, it is now possible to directly impart an image to a photosensitive matrix without the need for a mask. Instead, coherent energy can be directed onto the surface of the photosensitive matrix in the desired pattern. Because certain actinic wavelengths are produced relatively inefficiently and because laser imaging exposures are very brief (on the order of $30 \times 10^{-9}$ seconds per pixel), the use of highly sensitive resins is required in order to avoid the problems associated with an insufficient exposure of the imaged matrix. Problems encountered with negative acting materials include lack of resin strength, poor resilience, solvent swell (due to the generation of inadequate molecular weights during the curing process), and the need for extended exposure times. Problems encountered with positive acting materials include insufficient transformation of the positive exposing material for complete removal from the matrix in order to create the desired image, and the need for extended exposure times.

To address these problems, efforts have been made to develop more highly reactive photosensitive resins. Such materials would be expected to give more complete photoreaction (e.g., crosslinking, dissolution of crosslink bonds, rearrangement, and the like), even with brief laser exposures, as the desired image is scanned onto the photosensitive resin.

Alternatively, conventional photosensitive photoimageable materials (i.e., known resins which are not so highly photosensitive or reactive) may find wider use in the field of laser imaging if methods and apparatus can be developed to further enhance the exposure sensitivity of such materials. Since there is a large variety of conventional photosensitive photoimageable materials, such methodology would likely find widespread applicability.

Thus, there is a clear need in the art for methods and apparatus to enhance the "imagewise" exposure sensitivity of photosensitive materials, thereby permitting photoimaging to proceed as rapidly as possible, allowing for the rapid conversion of these photosensitive materials into finished articles, and providing for the widespread use of conventional resins in photosensitive imaging applications.

BRIEF DESCRIPTION OF THE INVENTION

In accordance with one aspect of the present invention, there are provided apparatus which use otherwise wasted laser energy to subject photosensitive materials to a relatively low energy pre-exposure (i.e., via a backscan beam exposure) prior to subjecting such materials to an imagewise exposure (i.e., an imaging beam exposure). Invention apparatus provide an increase of the effective exposure sensitivity of a wide variety of photosensitive materials, allowing shorter exposure times and increased exposure speeds, and providing improved image quality (i.e., resolution of fine detail) in the exposed photosensitive material.

In accordance with an additional aspect of the present invention, there are provided methods for enhancing the imagewise exposure of photosensitive materials, imagewise exposed photosensitive materials made according to these methods, methods for enhancing sensitivity of a photosensitive material for imagewise exposure, and photosensitive materials having enhanced sensitivity for imagewise exposure made according to these methods. Invention methods, and exposed and enhanced sensitivity photosensitive materials, provide for increased exposure sensitivity of a wide variety of photosensitive materials.

BRIEF DESCRIPTION OF THE FIGURES

FIG. 1 collectively depicts a cross-sectional representation (left rear view) of an apparatus according to the present invention.

DETAILED DESCRIPTION OF THE INVENTION

Figure 1A:
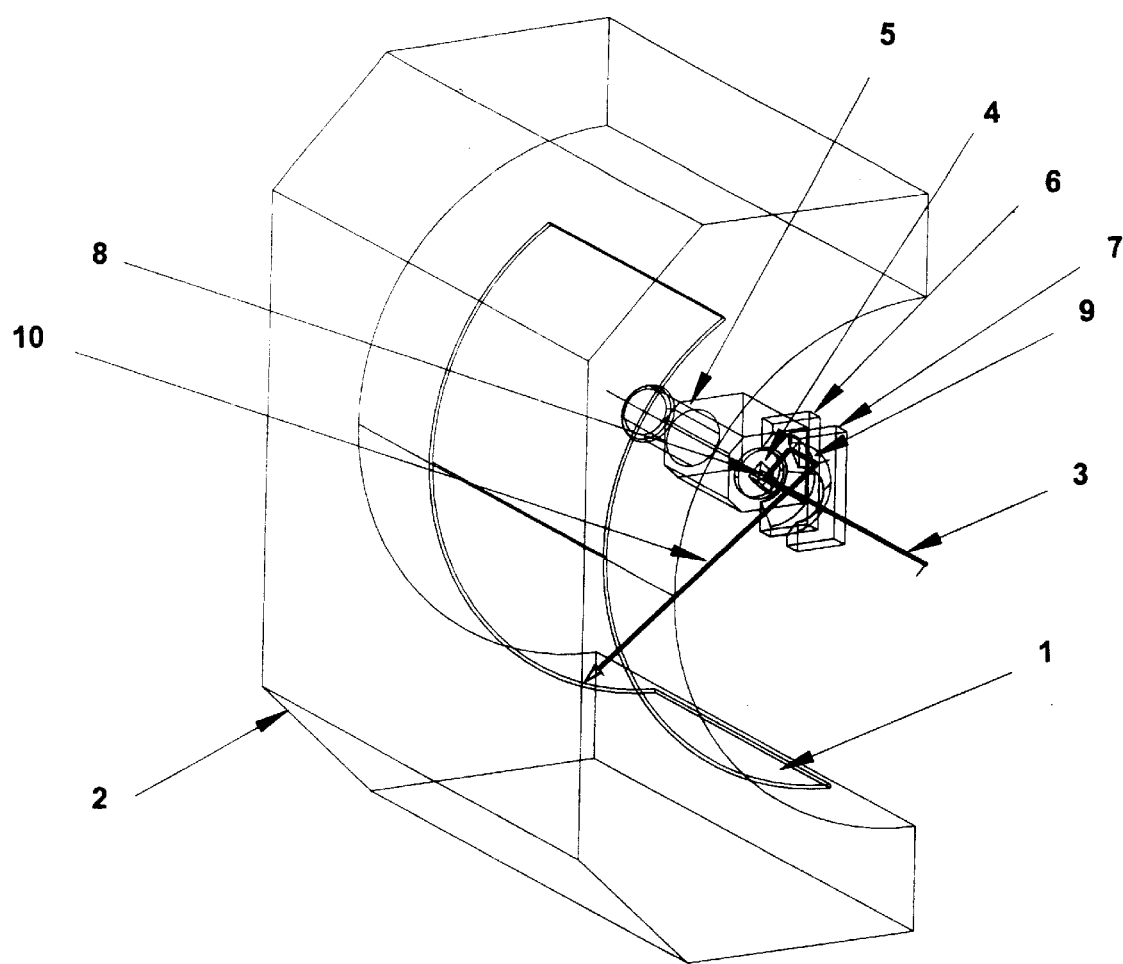
FIG. 1A depicts an apparatus according to the invention, wherein the spinning deflection assembly of the apparatus is oriented so as to provide a backscan beam.

In accordance with the present invention, there are provided apparatus for the enhanced imagewise exposure of a photosensitive material. Invention apparatus comprise an internal drum or flat bed, a laser source, a spinning deflection assembly, a supplemental optical component, and a control mechanism.

Photosensitive materials contemplated for use in the practice of the present invention include letterpress printing plates, flexographic printing plates, offset printing plates, graphic arts films and proofing materials, photoresists, circuit board resists, stereolithography resins, and the like. Such materials can be prepared from a variety of photoimageable compositions, such as, for example, (meth) acrylate-based resins (see, for example, U.S. Pat. No. 5,348,844, incorporated herein by reference), thiolene-based resins (see, for example, U.S. Pat. No. 3,783,152, incorporated herein by reference), vinyl ether-based resins (see, for example, U.S. Pat. No. 5,446,073, incorporated herein by reference), cationic-based resins (see, for example, U.S. Pat. No. 5,437,964, incorporated herein by reference), diazonium-based resins (see, for example, U.S. Pat. No.

4,263,392, incorporated herein by reference), and the like, as well as suitable combinations of any two or more thereof. Suitable photosensitive materials for use in the practice of the present invention can also encompass those using an ablatable mask (see, for example U.S. Pat. No. 5,262,275, incorporated herein by reference).

Photosensitive materials contemplated for use in the present invention can have varying thicknesses, depending on the end use contemplated for such photosensitive materials. For example, for letterpress printing plate applications, the thickness of the photosensitive material can vary in the range from about 5 mils to about 50 mils, with a preferred range from about 10 mils to about 30 mils. Further, for flexographic printing plate applications, the thickness of the photosensitive material can vary in the range from about 8 mils to about 250 mils, with a preferred range from about 10 mils to about 120 mils, and a presently preferred range from about 13 mils to about 70 mils. Similarly, for circuit board applications, the thickness of the photosensitive material can vary in the range from about 0.25 mils to about 4 mils, with a preferred range from about 1 mil to about 2.5 mils. Further, for graphic art film applications, the thickness of the photosensitive material can vary in the range from about 0.4 microns to about 2 microns, with a preferred range from about 0.6 microns to about 1.1 microns. Additionally, for stereolithography applications, the thickness of the photosensitive layer to be imaged can vary in the range from about 1 mil to about 20 mils, with a preferred range from about 3 mils to about 10 mils. In addition, for ablatable mask applications, the thickness of the photosensitive material can vary in the range from about 0.4 microns to about 4 microns.

Internal drum or flat bed equipment contemplated for use in the practice of the present invention includes interior arc devices (also known as internal drum devices; see, for example, U.S. Pat. No. 5,385,092 and U.S. Pat. No. 4,054,928, each of which is hereby incorporated by reference herein), flat-bed devices, and the like. Such internal drum or flat beds typically have a rotational axis associated therewith, which is generally the axis around which the internal drum or flat bed can rotate so as to form a cylinder (or, in the case of the flat-bed device, a thick-skinned cylindrical surface) with the interior surface of the internal drum or flat bed. In addition, such internal drum or flat beds are commonly capable of receiving the photosensitive material on their interior surface.

Laser sources contemplated for use in the practice of the present invention include sources capable of providing coherent electromagnetic energy of suitable energy to promote imaging of photosensitive materials via reflection or refraction of the electromagnetic energy, e.g., ion gas lasers (e.g., argon ion lasers, krypton lasers, helium:cadmium lasers, and the like), solid state lasers (e.g., Nd:YAG, frequency-doubled Nd:YAG lasers, and the like), semiconductor diode lasers, molecular gas lasers (e.g., carbon dioxide lasers, and the like), and the like, and suitable combinations of two or more thereof. Such laser sources are generally operatively associated with the internal drum or flat bed, and are capable of emitting electromagnetic energy in the spectral range to which the photosensitive material is reactive. Further, the electromagnetic energy emitted by the laser source is capable of operating as an imaging beam to directly write image data onto the photosensitive material.

As utilized herein, the term "operatively associated with" includes direct or indirect connections (e.g., functional components which permit the exchange of information, and the like) between two or more elements which permit the elements to operate and/or function as part of a cohesive whole.

As utilized herein, the term "electromagnetic energy" includes any coherent electromagnetic radiation (e.g., actinic radiation) capable of initiating, with or without concentration of the electromagnetic radiation, photochemical and/or photophysical reactions (e.g., photopolymerization, photorearrangements, ablation and the like) of the photosensitive materials. Electromagnetic energy generally can be continuous wave or pulsed. The spectral range (e.g., wavelength, frequency, and the like) of the electromagnetic energy contemplated for use in the practice of the present invention commonly is in the ultraviolet spectral range, the visible spectral range, or the infrared spectral range. Preferred spectral ranges of the electromagnetic energy are those which correspond to the spectral sensitivity of the photosensitive material being subjected to the imaging beam.

As utilized herein, the term "imaging beam" includes electromagnetic energy which imparts to the photosensitive material no less than the threshold level of energy required to initiate a substantial degree of photoimaging (e.g., photopolymerization, photorearrangements, ablation and the like) of the photosensitive material. The "threshold level" required to initiate a substantial degree of photoimaging of the photosensitive material can vary widely, depending on such factors as the particular photosensitive material being imaged, the processing methodology employed for developing the imaged material, and the like. Electromagnetic energy levels commonly are said to not exceed threshold levels when the photosensitive material exposed to the electromagnetic energy remains substantially unchanged from its state prior to exposure.

As utilized herein, the term "image data" includes any data (e.g., images, letters, symbols, drawings, photos and the like) to be imparted to the photosensitive material.

Spinning deflection assemblies contemplated for use in the practice of the present invention include spinning mirrors, spinning prisms, and the like. Such spinning deflection assemblies are commonly operatively associated with the internal drum or flat bed and the laser source. Further, such spinning deflection assemblies are typically capable of redirecting at least a portion(s) of the electromagnetic energy emitted by the laser source (i.e., through external reflection (for a spinning mirror) or through internal reflection (for a spinning prism)), commonly from the rotation axis of the internal drum to the photosensitive material mounted on the internal drum or flat bed. The redirected portion(s) of the electromagnetic energy can serve as the imaging beam and/or the backscan beam, so long as the apparatus (and, preferably, the combination of the laser source, the spinning deflection assembly and the supplemental optical component) provides for both an imaging beam and a backscan beam to contact the internal drum or flat bed.

A common embodiment of the internal drum or flat bed is that it typically subtends only about 180 degrees of arc. Therefore, as the spinning deflection assembly rotates through 360 degrees, the spinning deflection assembly deflects the electromagnetic energy directly toward the surface of the internal drum or flat bed for only about 50% of the total scan time. During this portion of the scan, the radiation is used to impart image data to the photosensitive material mounted on the internal drum or flat bed. The portion of each rotation that the spinning mirror assembly is pointed away from the internal drum or flat bed is called the "backscan". During the backscan, the laser radiation is typically unused and, therefore, wasted. The current invention uses the radiation emitted by the laser during each backscan to enhance the sensitivity of the photosensitive material to the imaging step.

When the spinning deflection assembly comprises a spinning mirror, the deflected portion contacts the internal drum or flat bed, either directly (i.e., immediately after contacting the spinning deflection assembly and without contacting the supplemental optical component) as an imaging beam, or indirectly (i.e., subsequently after contacting the spinning deflection assembly and other components of the apparatus (e.g., the supplemental optical component)) as a backscan beam. Preferably, the spinning deflection assembly suitable for use in the practice of the present invention comprises a spinning mirror which both deflects a portion of the electromagnetic energy to contact the internal drum or flat bed directly as an imaging beam, and deflects a part of the electromagnetic energy to contact the internal drum or flat bed indirectly as a backscan beam in advance of the imaging beam.

When the spinning deflection assembly comprises a spinning prism, the electromagnetic energy can be deflected by total internal reflection. Thus, the deflected portion commonly contacts the internal drum or flat bed, either directly (i.e., immediately after contacting the spinning deflection assembly) as an imaging beam, or indirectly (i.e., subsequently after contacting the spinning deflection assembly and other components of the apparatus (e.g., a supplemental optical component)) as a backscan beam.

Commonly, the redirected portion of the electromagnetic energy can move across the internal drum or flat bed simultaneously or sequentially across an arc segment of the internal drum or flat bed and across a line segment perpendicular to the arc segment and parallel to the internal drum or flat bed's rotational axis.

As utilized herein, the term "backscan beam" includes electromagnetic energy which is less than the threshold level of electromagnetic energy required to initiate a substantial level degree of photoimaging of the photosensitive material.

Typically, the backscan beam imparts energy in the range from about 10% to about 99% of the threshold level required to initiate substantial curing the photosensitive material, with a preferred range of about 75% to about 99% of the threshold level, and a presently preferred range of about 80% to about 95% of the threshold level.

Generally, the backscan beam will have a wavelength or wavelengths comparable to the wavelength(s) employed for the imaging beam.

Optionally, the backscan beam provided by the apparatus is capable of irradiating the entire area of the photosensitive material that is intended for subsequent exposure to the imaging beam.

Commonly, the intensity (i.e., energy level) of the backscan beam does not vary by more than+or–50% across the portion of the photosensitive material contacted by the backscan beam.

In accordance with the present invention, the area of photosensitive material subjected to the backscan beam (at any particular point in time) is at least as great as the area of the same portion of the photosensitive material as is to be subjected to the imaging beam substantially immediately following contact by the backscan beam. In a preferred embodiment, the backscan beam produces a spot size on the photosensitive material which is larger than that to be produced by the imaging beam.

Supplemental optical components contemplated for use in the practice of the present invention include mirrors, prisms, and the like, and suitable combinations of any two or more thereof. Such supplemental optical components are commonly operatively associated with the spinning deflection assembly. Further, such supplemental optical components are generally capable of receiving and redirecting electromagnetic energy as follows. During at least a part of the time when the electromagnetic energy is not being directly reflected from the spinning deflection assembly to the photosensitive material as the imaging beam, such supplemental optical components are capable of receiving at least a portion of the electromagnetic energy directed by the spinning deflection assembly to contact the supplemental optical component Then, such supplemental optical components are typically capable of redirecting this received portion toward the internal drum or flat bed (and any photosensitive material thereon). This redirected portion can function as a backscan beam capable of contacting the photosensitive material at a time interval in advance of the imaging beam.

Further, such supplemental optical components can be variously shaped and can be plural, so long as the shape(s) is capable of both receiving at least a portion of the electromagnetic energy directed by the spinning deflection assembly and redirecting this received portion as a backscan beam capable of contacting the photosensitive material at a time interval in advance of the imaging beam, or as an imaging beam capable of contacting a photosensitive material at a time interval behind the backscan beam, as discussed above. In a preferred embodiment, such supplemental optical components comprise a pair of substantially conical surfaces, which typically share the same rotational axis as the internal drum or flat bed.

In addition, such supplemental optical components can further comprise ancillary optics. These ancillary optics can be selected from any optics which function to homogenize, modify and/or attenuate the backscan beam. Exemplary ancillary optics include band pass filters, cut off filters, neutral density filters, mechanical shutters, half-wave plates, electro-optic modulators, polarizers, depolarizers, and the like.

Additionally, such supplemental optical components can further comprise reflective surfaces (e.g., mirrors and the like), refractive surfaces (e.g., prisms and the like), or any suitable combination of the two. These reflective surfaces and refractive surfaces can be selected from surfaces which function to receive at least a portion of the electromagnetic energy directed by the spinning deflection assembly as a backscan beam. In addition, these reflective surfaces and refractive surfaces can be selected from surfaces which function to redirect this received portion as a backscan beam capable of contacting the photosensitive material at a time interval in advance of the imaging beam.

Additional optional components contemplated for use in conjunction with the supplemental optical components can be selected so as to be capable of attenuating the intensity of the reflected backscan beam. Attenuation can be accomplished by any means known to those of skill in the art, so long as the electromagnetic energy received and directed by the supplemental optical components is capable of functioning as a backscan beam. Exemplary methods of accomplishing this attenuation of the intensity of the backscan beam include amplitude and/or pulse width (frequency) modulation of the backscan beam; physical modulation of the backscan beam (e.g., by filtration, by the use of a mechanical shutter, or the like); and the like.

In addition, the location and/or orientation of such supplemental optical components and the additional optional components can be fixed or variable relative to the location and/or orientation of the spinning deflection assembly.

The time interval by which the backscan beam can contact the photosensitive material in advance of the imaging beam can be any time interval in the range of from about 1 millisecond to about 60 seconds, and preferably in the range of about 1 millisecond to about 10 seconds, with a presently preferred range from about 100 milliseconds to about 3 seconds.

Various control mechanisms known to those of skill in the art can be adapted for use in the practice of the present invention. Such control mechanisms include digital electronics employing rotary encoders, timing circuits, frequency generators, and the like. Such control mechanisms are typically operatively associated with the laser source, the spinning deflection assembly and/or the supplemental optical component. Further, such control mechanisms are commonly capable of controlling the characteristics of the electromagnetic energy, the location and the orientation of the spinning deflection assembly and of the supplemental optical component relative to one another and relative to the internal drum or flat bed, and the like (e.g., other variables associated with utilizing an apparatus comprising such components for the imaging process).

Additionally, such control mechanisms can comprise a first control mechanism component operatively associated with the laser source, a second control mechanism component operatively associated with the spinning deflection assembly, and optionally a third control mechanism component operatively associated with the supplemental optical component, wherein each of the control mechanism components is operatively associated with the other(s).

In accordance with another aspect of the present invention, there are provided combinations for the enhanced imagewise exposure of a photosensitive material. Invention combinations comprise an internal drum or flat bed, a laser source, a spinning deflection assembly, a supplemental optical component, and at least one control mechanism. These combinations are useful for preparing apparatus in accordance with the present invention.

In accordance with a further aspect of the present invention, there are provided certain improvements to apparatus for the imagewise exposure of a photosensitive material, wherein these apparatus comprise an internal drum or flat bed, a laser source, a spinning deflection assembly, and a control mechanism, operatively associated with the laser source and with the spinning mirror assembly, which control mechanism is capable of controlling the intensity of the electromagnetic energy and of controlling the location and orientation of the spinning deflection assembly relative to the internal drum or flat bed.

Invention improvements to the apparatus comprise a supplemental optical component, operatively associated with the spinning mirror assembly. This supplemental optical component is typically capable of receiving and redirecting electromagnetic energy as follows. During at least a part of the time when the electromagnetic energy is not being directly reflected from the spinning deflection assembly to the photosensitive material as the imaging beam, this supplemental optical component is capable of receiving at least a portion of the electromagnetic energy directed by the spinning deflection assembly to contact the supplemental optical component. Then, this supplemental optical component is generally capable of redirecting this received portion toward the internal drum or flat bed (and any photosensitive material thereon). This redirected portion can function as a backscan beam capable of contacting the photosensitive material at a time interval in advance of the imaging beam.

Further, invention improvements generally are characterized in that the control mechanism is operatively associated with the supplemental optical component, and is further capable of controlling the location and the orientation of the supplemental optical component relative to the spinning deflection assembly and relative to the internal drum or flat bed. This capability of controlling exhibited by the control mechanism includes being capable of providing for various locations and orientations of the supplemental optical component relative to the spinning deflection assembly. Preferred locations and orientations include those required to permit the spinning deflection assembly to direct at least a portion of the electromagnetic energy to contact the supplemental optical component. In a presently preferred embodiment, these preferred locations and orientations are achievable during at least a part of the time when the electromagnetic energy is not being directly reflected from the spinning deflection assembly to the photosensitive material as the imaging beam.

In accordance with an additional aspect of the present invention, there are provided methods for enhancing the imagewise exposure of a photosensitive material. Invention methods comprise:

subjecting a coherent beam of electromagnetic energy, in the spectral range to which the photosensitive material is reactive, to conditions sufficient to generate, from the coherent beam, an imaging beam capable of causing reaction of the photosensitive material and a backscan beam having a lesser capability of reacting the photosensitive material than the imaging beam; and contacting the photosensitive material with the backscan beam and the imaging beam, wherein the backscan beam contacts the photosensitive material at a time interval in advance of the imaging beam.

In accordance with a further aspect of the present invention, there are provided imagewise exposed photosensitive materials made according to the above invention methods. These exposed photosensitive materials can commonly be produced at a lower cost than photosensitive materials which incorporate more highly reactive photosensitive resins (i.e., due to the use of conventional resins as opposed to more expensive specialized resins). Further, these exposed photosensitive materials are more sensitive to exposure to image data (i.e., provide for greater resolution and detail) than exposed photosensitive materials which utilize conventional resins and are exposed utilizing conventional methodology. In addition, these exposed photosensitive materials typically are exposed at equivalent or lower cost than photosensitive materials which either incorporate more highly reactive photosensitive resins or are exposed utilizing conventional methodology (i.e., due to the capture and utilization of otherwise wasted electromagnetic energy, and/or the resulting lower energy imaging beam required for exposure).

In accordance with another aspect of the present invention, there are provided methods for enhancing sensitivity of a photosensitive material for imagewise exposure. Invention methods comprise:

subjecting a coherent beam of electromagnetic energy, in the spectral range to which the photosensitive material is reactive, to conditions sufficient to generate, from the coherent beam, an imaging beam capable of causing reaction of the photosensitive material and a backscan beam having a lesser capability of reacting the photosensitive material than the imaging beam; and contacting the photosensitive material with the backscan beam at a time interval in advance of the imaging beam.

In accordance with a further aspect of the present invention, there are provided photosensitive materials having enhanced sensitivity for imagewise exposure made according to the foregoing aspect of the above invention methods. These photosensitive materials can generally be produced at a lower cost than photosensitive materials which incorporate more highly reactive photosensitive resins (i.e., due to the use of conventional resins as opposed to more expensive specialized resins). Further, these photosensitive materials are more sensitive to exposure to image data (i.e., provide for greater resolution and detail) than photosensitive materials which utilize conventional resins and are exposed utilizing conventional methodology. In addition, these photosensitive materials typically can be exposed at equivalent or lower cost than photosensitive materials which either incorporate more highly reactive photosensitive resins or are exposed utilizing conventional methodology (i.e., due to the capture and utilization of otherwise wasted electromagnetic energy, and/or the resulting lower energy imaging beam required for exposure).

Referring now to FIGS. 1A, 1B, and 2–3, the invention apparatus and methods are described in greater detail with reference to the specific, non-limiting embodiment shown in the Figures.

Thus, for example, a photosensitive material (1) can be supported by an internal drum or flat bed (2). A laser source (outside of FIG. 1A) emits a coherent beam of electromagnetic radiation (3). This coherent beam contacts a mirror (4), which is capable of spinning about the axis defined by the coherent beam in accordance with the operation of a spinner motor (5).

The mirror, when spun so as to be oriented as in FIG. 1A, deflects the coherent beam to contact the first of a pair of opposed, hemiconical mirrors (6, 7) (i.e., the supplemental optical components of FIG. 1A). The first hemiconical mirror (6) receives this deflected coherent beam (8), and reflects (i.e., redirects) this deflected coherent beam (8) toward the second hemiconical mirror (7). The second hemiconical mirror (7) receives this reflected coherent beam (9), and reflects (i.e., redirects) this reflected coherent beam (9) a second time toward the photosensitive material (1) as a backscan beam (10).

Figure 1B:
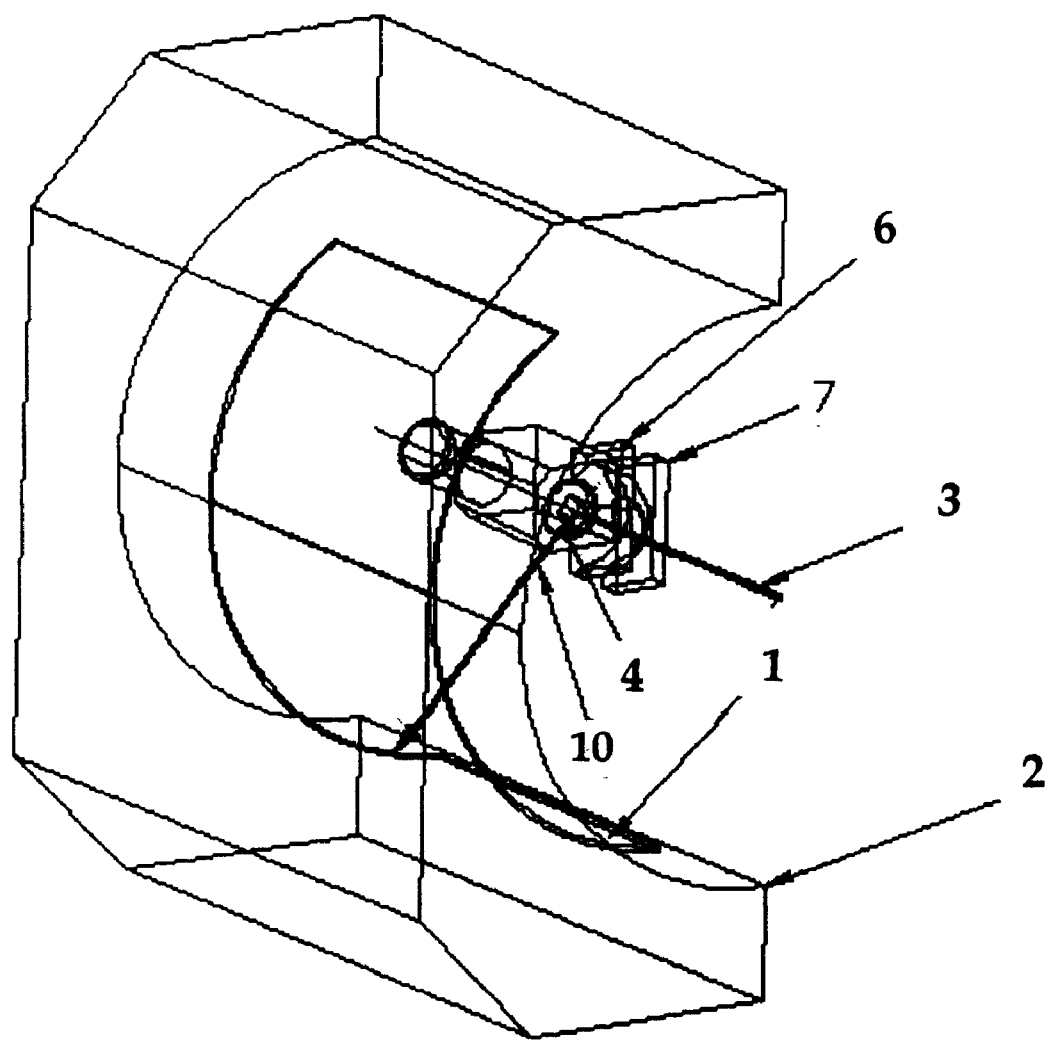
FIG. 1B depicts an apparatus according to the invention, wherein the spinning deflection assembly of the apparatus is oriented so as to provide an imaging beam.

Alternatively, the mirror, when spun so as to be oriented as in FIG. 1B, deflects the coherent beam (3) to contact the photosensitive material (1) as an imaging beam.

Figure 2:
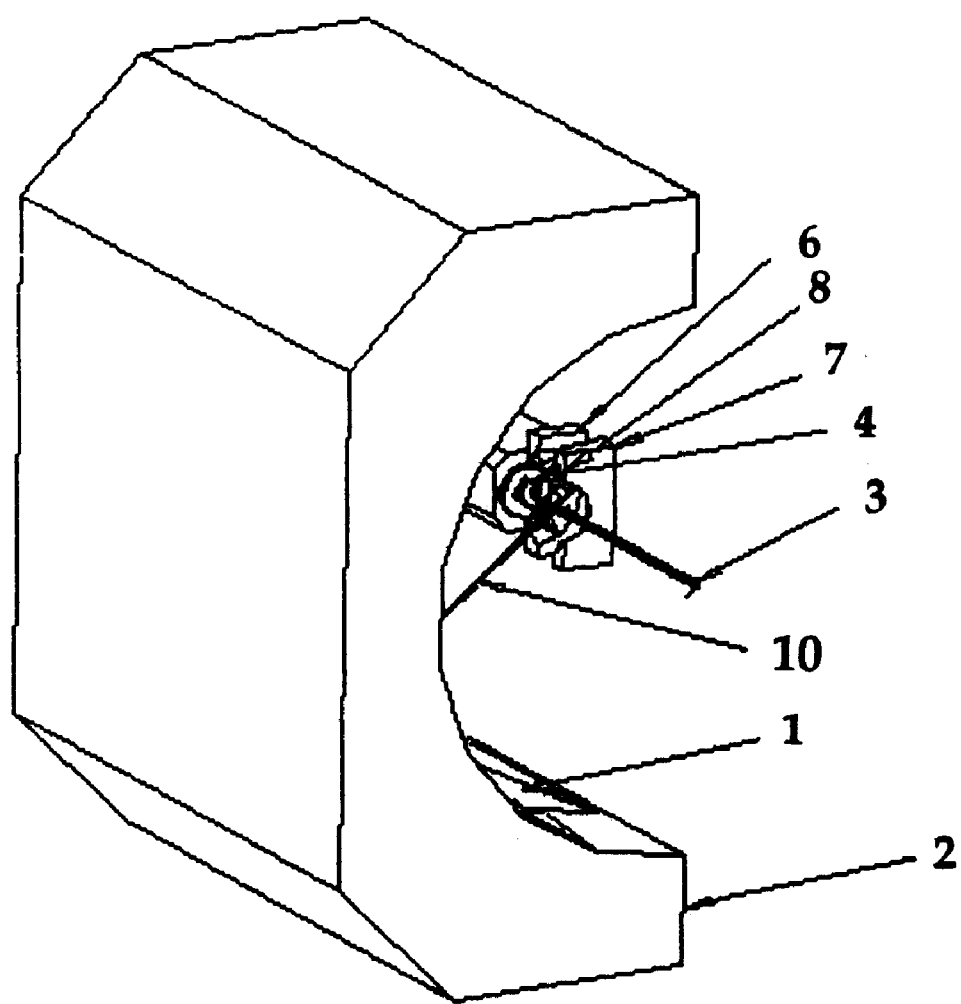
FIG. 2 depicts a block figure cross-sectional representation (left rear view) of an apparatus according to the present invention.
Figure 3:
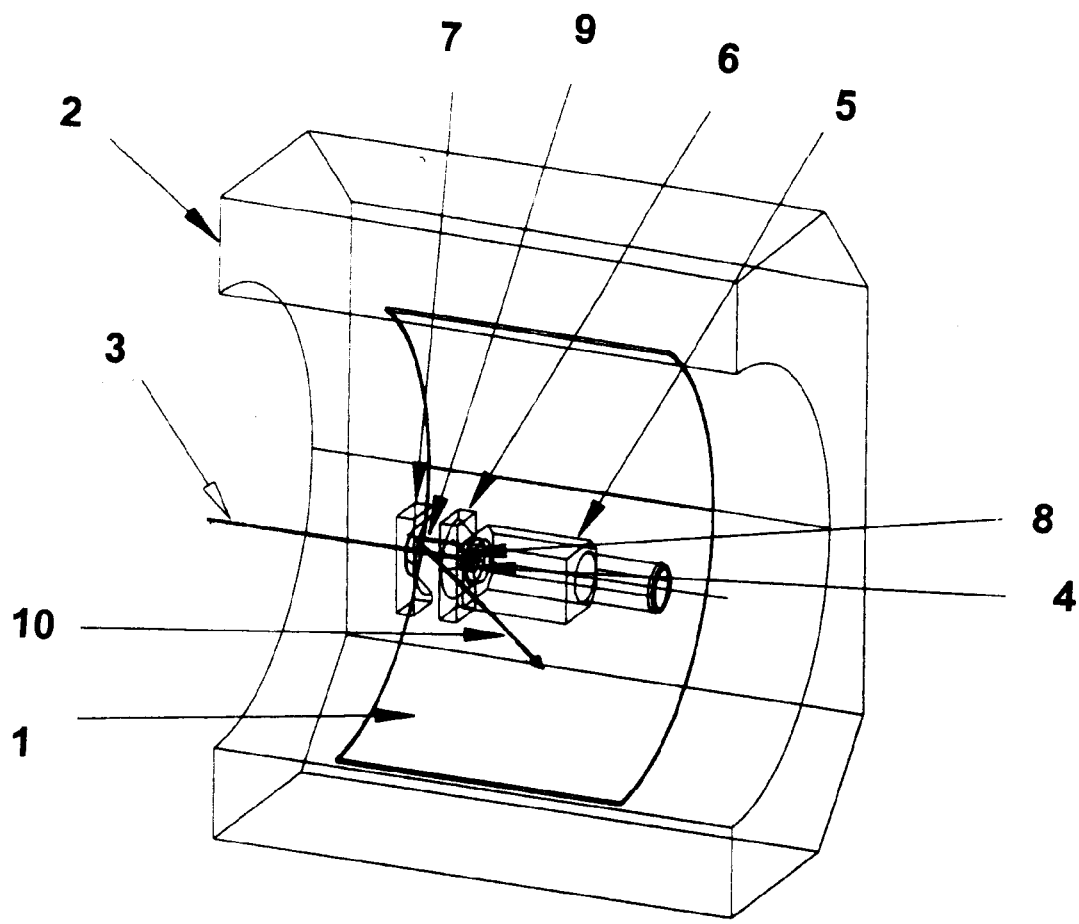
FIG. 3 depicts a block figure representation (front right view) of an apparatus according to the present invention.

FIG. 2 depicts the apparatus and method of FIG. 1A from a similar angle as FIG. 1A (i.e., left, rear view), omitting the "see-through" characterization of the invention apparatus depicted in FIG. 1A. FIG. 3 depicts the apparatus and method of FIG. 1A from a different angle than FIG. 1A (i.e., front, right view).

While the invention has been described in detail with reference to certain preferred embodiments thereof, it will be understood that modifications and variations are within the spirit and scope of that which is described and claimed.

That which is claimed is:

1. An apparatus for the enhanced imagewise exposure of a photosensitive material, the apparatus comprising:

an internal drum or flat bed having a rotational axis associated therewith and capable of receiving the photosensitive material;

a laser source operatively associated with the internal drum or flat bed and capable of emitting electromagnetic energy in the spectral range to which the photosensitive material is reactive, wherein the electromagnetic energy is capable of operating as an imaging beam to write image data onto the photosensitive material;

a spinning deflection assembly operatively associated with the internal drum or flat bed and said laser source, wherein said spinning deflection assembly is capable of directing at least a portion of the electromagnetic energy emitted by said laser source to contact said internal drum or flat bed and to move across said internal drum or flat bed simultaneously or sequentially across an arc segment of the internal drum or flat bed and across a line segment perpendicular to the arc segment and parallel to the rotational axis;

a supplemental optical component operatively associated with the spinning deflection assembly, wherein the supplemental optical component is capable of receiving at least a portion of the electromagnetic energy directed by the spinning deflection assembly to contact the supplemental optical component during at least a part of the time when the electromagnetic energy is not being utilized as the imaging beam, and wherein the supplemental optical component is further capable of directing the portion as a backscan beam capable of contacting the photosensitive material at a time interval in advance of the imaging beam; and a control mechanism, operatively associated with the laser source, the spinning deflection assembly and the supplemental optical component, wherein said control mechanism is capable of controlling the characteristics of the electromagnetic energy and the location and the orientation of the spinning deflection assembly and of the supplemental optical component relative to one another and relative to the internal drum or flat bed.

2. The apparatus of claim 1, wherein the photosensitive material is a letterpress printing plate, a flexographic printing plate, an offset printing plate, a graphic arts film, a graphic arts proofing material, an ablatable mask or a photoresist.

3. The apparatus of claim 1, wherein the electromagnetic energy is continuous wave or pulsed.

4. The apparatus of claim 1, wherein the spectral range of the electromagnetic energy is in the ultraviolet spectral range, the visible spectral range, or the infrared spectral range.

5. The apparatus of claim 1, wherein the apparatus is further capable of making the backscan beam irradiate the entire area of the photosensitive material that is intended for exposure to the imaging beam.

6. The apparatus of claim 1, wherein the intensity of the backscan beam does not vary by more than 50% across the portion of the photosensitive material contacted by the backscan beam.

7. The apparatus of claim 1, wherein the backscan beam produces a spot size on the photosensitive material which is larger than that produced by the imaging beam.

8. The apparatus of claim 1, wherein the supplemental optical component comprises a pair of substantially conical surfaces sharing the same rotational axis as the internal drum or flat bed.

9. The apparatus of claim 1, wherein the supplemental optical component further comprises an ancillary optic selected from a band pass filter, a cut off filter, a neutral density filter, a mechanical shutter, a half-wave plate, an electro-optic modulator, a polarizer, or a depolarizer.

10. The apparatus of claim 1, wherein the supplemental optical component further comprises mirrors, prisms or any combination of the two.

11. The apparatus of claim 1, wherein the supplemental optical component optionally comprises an ancillary optic, and wherein the control mechanism, the supplemental optical component, or the ancillary optic is capable of attenuating the intensity of the reflected backscan beam by amplitude modulation of the backscan beam, by frequency modulation of the backscan beam, or by physical modulation of the backscan beam.

12. The apparatus of claim 11, wherein said physical modulation of the backscan beam is accomplished via filtration or via the use of a mechanical shutter.

13. The apparatus of claim 1, wherein the control mechanism comprises a first control mechanism component operatively associated with the laser source, a second control mechanism component operatively associated with the spinning deflection assembly, and optionally a third control mechanism component operatively associated with the supplemental optical component, wherein each of the control mechanism components are operatively associated with each other.

14. The apparatus of claim 1, wherein the location and the orientation of the supplemental optical component is fixed relative to the spinning deflection assembly.

15. The apparatus of claim 1, wherein the time interval is in the range of about 1 millisecond to about 60 seconds.

16. The apparatus of claim 1, wherein the time interval is in the range of about 1 millisecond to about 10 seconds.

17. A combination for the enhanced imagewise exposure of a photosensitive material, the combination comprising:
   an internal drum or flat bed having a rotational axis associated therewith and capable of receiving the photosensitive material; a laser source capable of emitting electromagnetic energy in the spectral range to which the photosensitive material is reactive, wherein the electromagnetic energy is capable of operating as an imaging beam to write image data onto the photosensitive material;
   a spinning deflection assembly capable of directing at least a portion of the electromagnetic energy emitted by said laser source to contact said internal drum or flat bed and to move across said internal drum or flat bed simultaneously or sequentially across an arc segment of the internal drum or flat bed and across a line segment perpendicular to the arc segment and parallel to the rotational axis;
   a supplemental optical component capable of receiving at least a part of the electromagnetic energy directed by the spinning deflection assembly to contact the supplemental optical component during at least a part of the time when the electromagnetic energy is not being utilized as the imaging beam, and wherein the supplemental optical component is further capable of directing the part as a backscan beam capable of contacting the photosensitive material at a time interval in advance of the imaging beam; and
   a control mechanism capable of controlling the intensity of the electromagnetic energy and the location and the orientation of the spinning deflection assembly and of the supplemental optical component relative to one another and relative to the internal drum or flat bed.

18. In an apparatus for the enhanced imagewise exposure of a photosensitive material, wherein the apparatus comprises
   an internal drum or flat bed having a rotational axis associated therewith and capable of receiving the photosensitive material,
   a laser source capable of emitting electromagnetic energy in the spectral range to which the photosensitive material is reactive, wherein the electromagnetic energy is capable of operating as an imaging beam to write image data onto the photosensitive material,
   a spinning deflection assembly capable of directing at least a portion of the electromagnetic energy emitted by said laser source to contact said internal drum or flat bed and to move across said internal drum or flat bed simultaneously or sequentially across an arc segment of the internal drum or flat bed and across a line segment perpendicular to the arc segment and parallel to the rotational axis, and
   a control mechanism, operatively associated with the laser source and with the spinning mirror assembly, which control mechanism is capable of controlling the intensity of the electromagnetic energy and of controlling the location and orientation of the spinning deflection assembly relative to the internal drum or flat bed,
   the improvement comprising:
   a supplemental optical component, operatively associated with the spinning mirror assembly, and capable of receiving at least a part of the electromagnetic energy directed by the spinning mirror assembly to contact the supplemental optical component during at least a part of the time when the electromagnetic energy is not being utilized as the imaging beam, and further capable of reflecting the part as a backscan beam capable of contacting the photosensitive material at a time interval in advance of the imaging beam;
   wherein the control mechanism is further operatively associated with the supplemental optical component, and is further capable of controlling the location and the orientation of the supplemental optical component relative to the spinning deflection assembly and relative to the internal drum or flat bed, including being capable of providing for the location and the orientation of the supplemental optical component relative to the spinning deflection assembly that is required to permit the spinning deflection assembly to direct at least a part of the electromagnetic energy to contact the supplemental optical component during at least a part of the time when the electromagnetic energy is not being utilized as the imaging beam.

* * * * *